(12) United States Patent
Kikuchi et al.

(10) Patent No.: US 11,339,810 B2
(45) Date of Patent: May 24, 2022

(54) FLUID LEAKAGE DETECTION SYSTEM

(71) Applicant: KYB Corporation, Tokyo (JP)

(72) Inventors: Takayoshi Kikuchi, Kanagawa (JP);
Keitaro Yoshida, Kanagawa (JP);
Takahiro Iwamoto, Kanagawa (JP)

(73) Assignee: KYB CORPORATION, Tokyo (JP)

( * ) Notice: Subject to any disclaimer, the term of this patent is extended or adjusted under 35 U.S.C. 154(b) by 32 days.

(21) Appl. No.: 16/759,289

(22) PCT Filed: Aug. 5, 2019

(86) PCT No.: PCT/JP2019/030765
§ 371 (c)(1),
(2) Date: Apr. 24, 2020

(87) PCT Pub. No.: WO2020/031973
PCT Pub. Date: Feb. 13, 2020

(65) Prior Publication Data
US 2020/0300277 A1 Sep. 24, 2020

(30) Foreign Application Priority Data

Aug. 10, 2018 (JP) .............................. JP2018-151708

(51) Int. Cl.
*F15B 15/14* (2006.01)
*F15B 20/00* (2006.01)
(Continued)

(52) U.S. Cl.
CPC ............ *F15B 20/005* (2013.01); *F15B 15/14* (2013.01); *G01M 3/26* (2013.01); *G01R 31/374* (2019.01); *G01R 31/3835* (2019.01)

(58) Field of Classification Search
CPC ... F15B 15/1461; F15B 20/005; F16J 15/004; G01R 31/374; G01R 31/3835
See application file for complete search history.

(56) References Cited

U.S. PATENT DOCUMENTS 3,943,717 A * 3/1976 Schexnayder ......... F16J 15/004
60/453
4,065,852 A * 1/1978 Bowbin .................. F16F 9/362
384/16
(Continued)

FOREIGN PATENT DOCUMENTS

| JP | H06207608 A | 7/1994 | |
| JP | 2006-028744 A | 2/2006 | |
| WO | WO-2017199607 A1 * | 11/2017 | .......... G01M 3/2869 |

*Primary Examiner* — Kenneth Bomberg
*Assistant Examiner* — Matthew Wiblin
(74) *Attorney, Agent, or Firm* — Rabin & Berdo, P.C.

(57) ABSTRACT

A fluid leakage detection system includes: a measurement unit configured to detect leakage of working oil in a hydraulic cylinder; and a controller configured to acquire a measurement result from the measurement unit, wherein the controller diagnoses that a battery depletion has been caused in a battery in a case in which it is determined that a data from the measurement unit has not been acquired and it is determined that the battery of the measurement unit has been in a low-remaining-battery-level state, and the controller diagnoses that a communication abnormality has been caused in a first communication part of the measurement unit in a case in which it is determined that the data from the measurement unit has not been acquired and it is determined that the battery has not been in the low-remaining-battery-level state.

6 Claims, 8 Drawing Sheets

(51) Int. Cl.
*G01R 31/3835* (2019.01)
*G01R 31/374* (2019.01)
*G01M 3/26* (2006.01)

(56) References Cited

U.S. PATENT DOCUMENTS

| | | | |
|---|---|---|---|
| 2008/0272554 A1* | 11/2008 | Nagel | F16J 15/004 |
| | | | 277/434 |
| 2017/0108399 A1* | 4/2017 | Rhee | G01M 13/005 |
| 2019/0048902 A1* | 2/2019 | Ooki | G01M 3/2815 |
| 2019/0324088 A1* | 10/2019 | Andersson | G01R 31/371 |
| 2019/0339330 A1* | 11/2019 | Bryngelsson | G01R 31/374 |

* cited by examiner

FLUID LEAKAGE DETECTION SYSTEM

TECHNICAL FIELD

The present invention relates to a fluid leakage detection system.

BACKGROUND ART

JP2006-28744A discloses a pressure detector that detects pressure of working fluid as a fluid detector that detects a state of the working fluid supplied to a fluid pressure device. Such a pressure detector has a detection unit that is brought into contact with the working fluid and an output unit that outputs values detected by the detection unit to an external device.

SUMMARY OF INVENTION

As a fluid leakage detection system for detecting occurrence of a fluid leakage in a fluid pressure cylinder, it is conceivable to attach the fluid detector such as that disclosed by JP2006-28744A to the fluid pressure cylinder and to allow a controller to determine whether or not a leakage of the working fluid has been caused on the basis of a measurement result by the fluid detector.

In such a case, if an abnormality is caused in the fluid detector, the leakage determination of the working fluid cannot be performed by the controller, and therefore, in order to detect the occurrence of the leakage of the working fluid with a high accuracy, it is required to perform an abnormality diagnosis on the fluid leakage detection system.

An object of the present invention is to provide a fluid leakage detection system capable of diagnosing an abnormality.

According to one aspect of the present invention, a fluid leakage detection system includes: a measurement unit provided on a fluid pressure cylinder, the measurement unit being configured to measure a state quantity of working fluid leaking out through a gap between a piston rod and a cylinder head; and a controller configured to acquire a measurement result from the measurement unit. The measurement unit has: a rod seal provided in the cylinder head, the rod seal being configured to seal the gap between the piston rod and the cylinder head; a detection space to which the working fluid leaked out through the rod seal is guided; and a measurement part configured to execute, under a predetermined operating conditions, measurement of the state quantity of the working fluid in the detection space and output of a measurement result. The measurement part has: a battery configured to function as a power source; a sensor part configured to measure the state quantity of the working fluid in the detection space; and a communication part configured to transmit a data containing the measurement result from the sensor part and a voltage of the battery to the controller through a wireless communication. The controller has: a data-acquisition determination part configured to determine whether or not the data has been input from the measurement part; a remaining-battery-level calculation part configured to calculate a remaining battery level based on the voltage of the battery; a remaining-battery-level determination part configured to determine whether or not the battery is in a low-remaining-battery-level state by comparing the remaining battery level calculated by the remaining-battery-level calculation part and a predetermined remaining-battery-level threshold value; and an abnormality diagnostic part configured to diagnose occurrence of an abnormality in the measurement part. The abnormality diagnostic part diagnoses that a battery depletion is caused in the battery when the data-acquisition determination part determines that the data is not acquired and when the remaining-battery-level determination part determines that the battery is in the low-remaining-battery-level state, and the abnormality diagnostic part diagnoses that a communication abnormality is caused in the communication part when the data-acquisition determination part determines that the data is not acquired and when the remaining-battery-level determination part determines that the battery is not in the low-remaining-battery-level state.

DESCRIPTION OF EMBODIMENTS

A fluid leakage detection system 100 according to an embodiment of the present invention will be described below with reference to the drawings.

First, an overall configuration of a fluid pressure system 101 provided with the fluid leakage detection system 100 will be described with reference to FIG. 1.

The fluid pressure system 101 is used in a construction machinery, in particular a hydraulic excavator, as a fluid pressure driven machinery. In the fluid pressure system 101, flows of working fluid supplied to/discharged from a plurality of fluid pressure cylinders are controlled to drive the fluid pressure cylinders.

Figure 1:
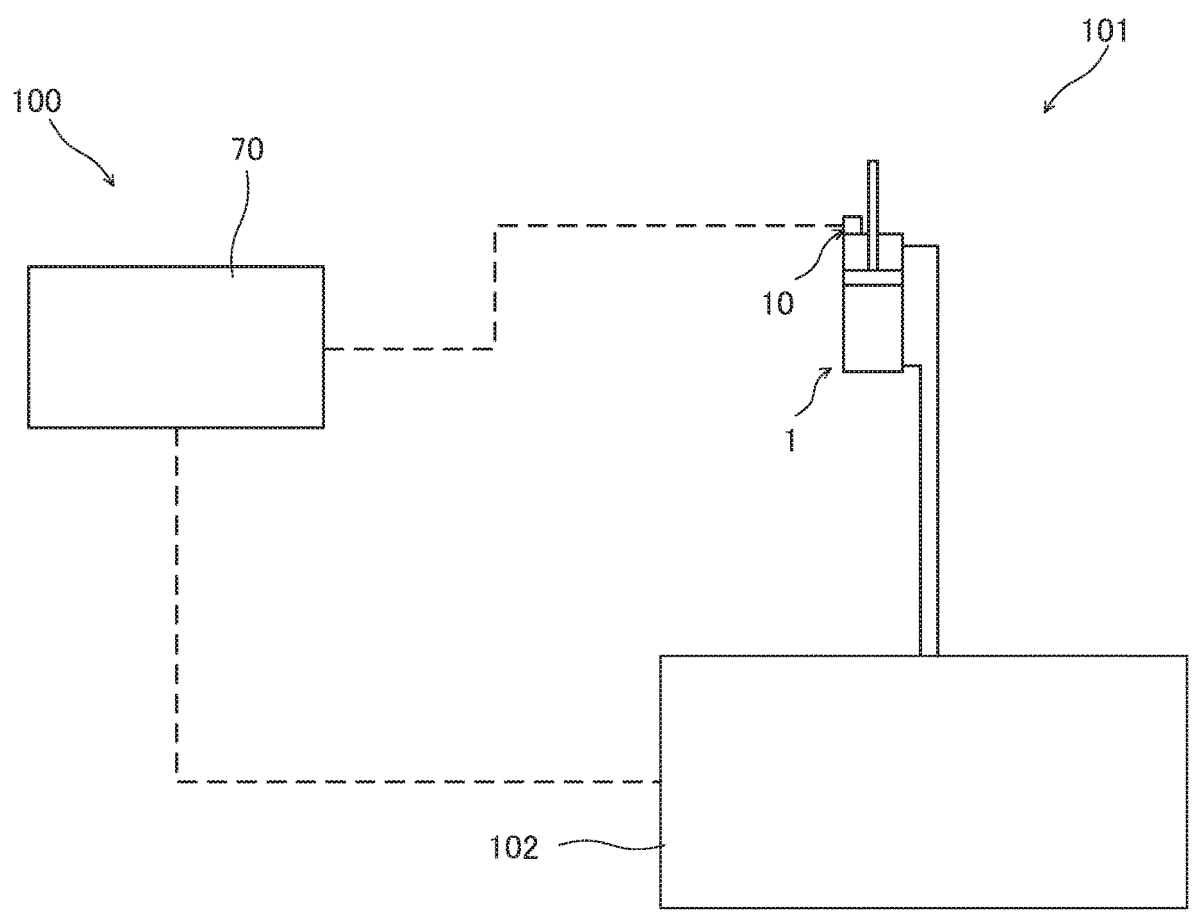
FIG. 1 is a schematic view showing a configuration of a fluid leakage detection system according to an embodiment of the present invention.

As shown in FIG. 1, the fluid pressure system 101 is provided with: a hydraulic cylinder 1 serving as the fluid pressure cylinder for driving objects to be driven (not shown), such as a boom, an arm, and a bucket: a fluid pressure control device 102 for controlling operation of the hydraulic cylinder 1 by controlling supply/discharge of working oil (the working fluid) to/from the hydraulic cylinder 1; and the fluid leakage detection system 100 for detecting an oil leakage through a rod seal 11 (see FIG. 3) serving as a seal member provided in the hydraulic cylinder 1.

Figure 2:
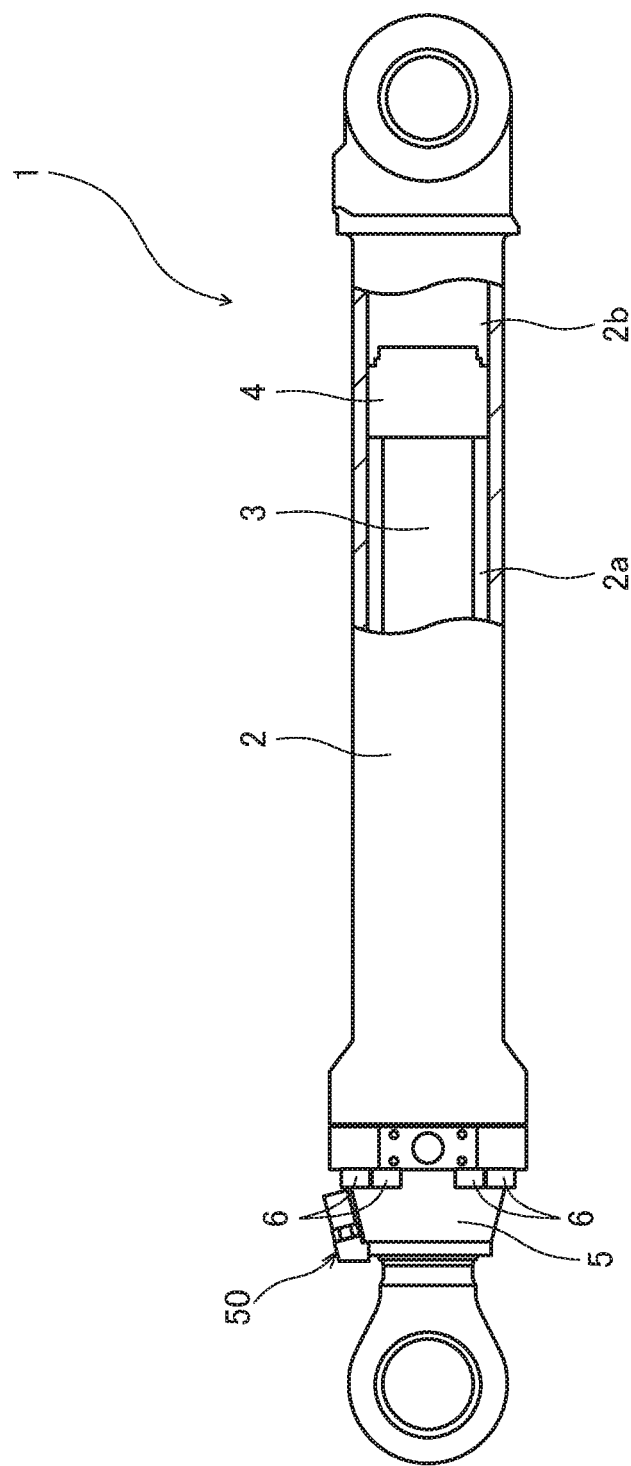
FIG. 2 is a partial cross-sectional view of a hydraulic cylinder according to the embodiment of the present invention.

As shown in FIG. 2, the hydraulic cylinder 1 is provided with a cylindrical cylinder tube 2, a piston rod 3 that is inserted into the cylinder tube 2, and a piston 4 that is provided on a base end of the piston rod 3. The piston 4 is provided so as to be freely slidable along an inner circumferential surface of the cylinder tube 2. An interior of the cylinder tube 2 is partitioned by the piston 4 into a rod-side chamber (fluid pressure chamber) 2a and a counter-rod-side chamber 2b.

The piston rod 3 has a tip end extending from an opening end of the cylinder tube 2. As the working oil is selectively guided from a hydraulic pressure source (not shown) to the rod-side chamber 2a or the counter-rod-side chamber 2b, the piston rod 3 is moved relative to the cylinder tube 2. As a result, the hydraulic cylinder 1 is extended/contracted.

A cylinder head 5 through which the piston rod 3 is inserted is provided on the opening end of the cylinder tube 2. The cylinder head 5 is fastened to the opening end of the cylinder tube 2 using a plurality of bolts 6.

Because a know configuration can be employed to the fluid pressure control device 102, detailed illustration and explanation thereof will be omitted. The fluid pressure control device 102 controls flow of the working oil guided to each hydraulic cylinder 1 from a hydraulic pump (the hydraulic pressure source), thereby driving each hydraulic cylinder 1.

Next, the fluid leakage detection system 100 will be described below in detail.

In the hydraulic cylinder 1, the fluid leakage detection system 100 detects occurrence of the oil leakage (fluid leakage) in which the working oil leaks out from the rod-side chamber 2a through a gap between an outer circumferential surface of the piston rod 3 and an inner circumferential surface of the cylinder head 5.

Figure 5:
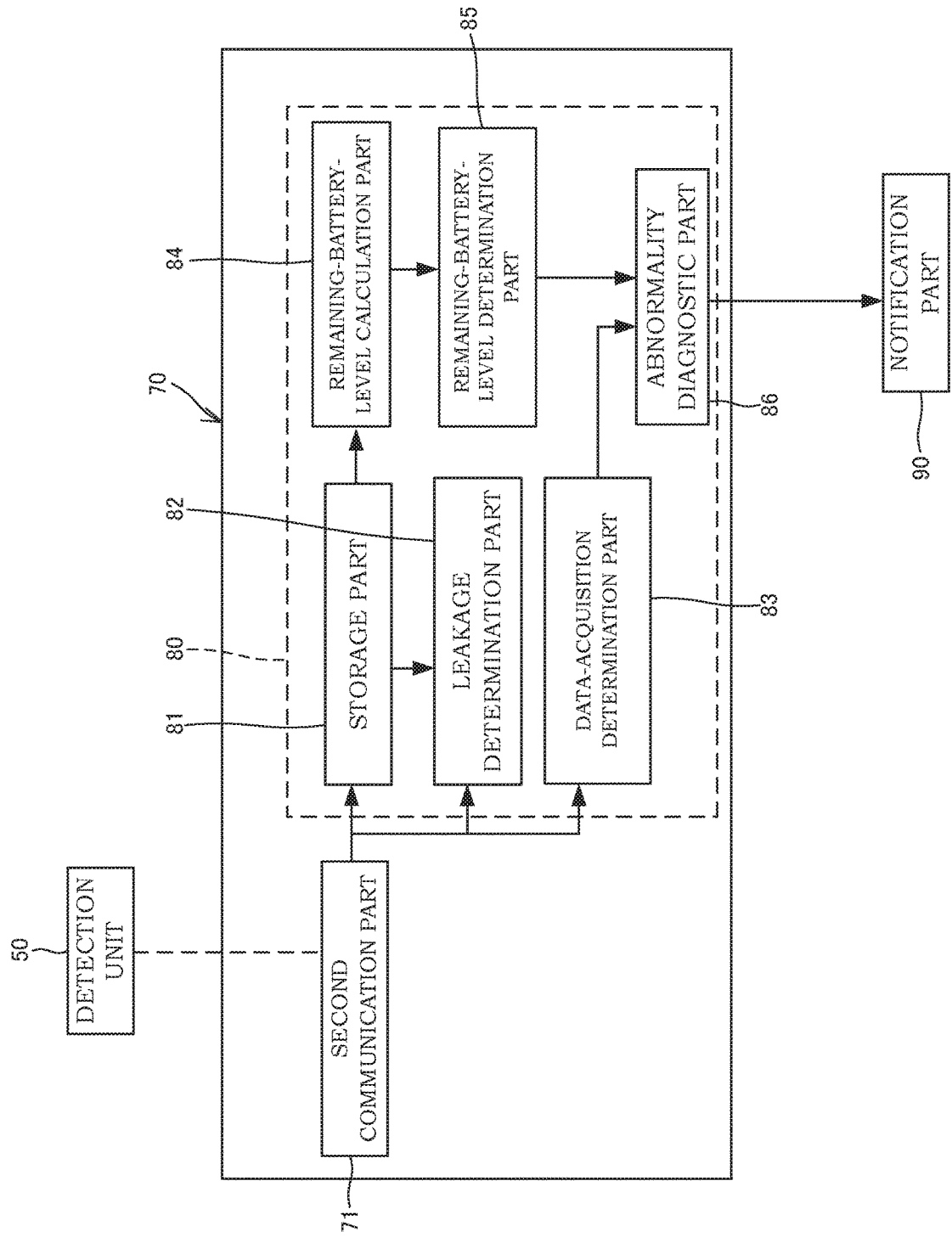
FIG. 5 is a block diagram showing a control unit of the fluid leakage detection system according to the embodiment of the present invention.

As shown mainly in FIGS. 1 and 3, the fluid leakage detection system 100 is provided with: a measurement unit 10 that is provided on the hydraulic cylinder 1 and measures the state quantity of the working oil leaking out through the annular gap (hereinafter referred to as "an annular gap 8") between the outer circumferential surface of the piston rod 3 and the inner circumferential surface of the cylinder head 5; a control unit 70 that determines the occurrence of the oil leakage in the hydraulic cylinder 1 on the basis of a measurement result from the measurement unit 10; and a notification part 90 that notifies an operator of the occurrence of an abnormality of the measurement unit 10 (see FIG. 5).

Figure 3:
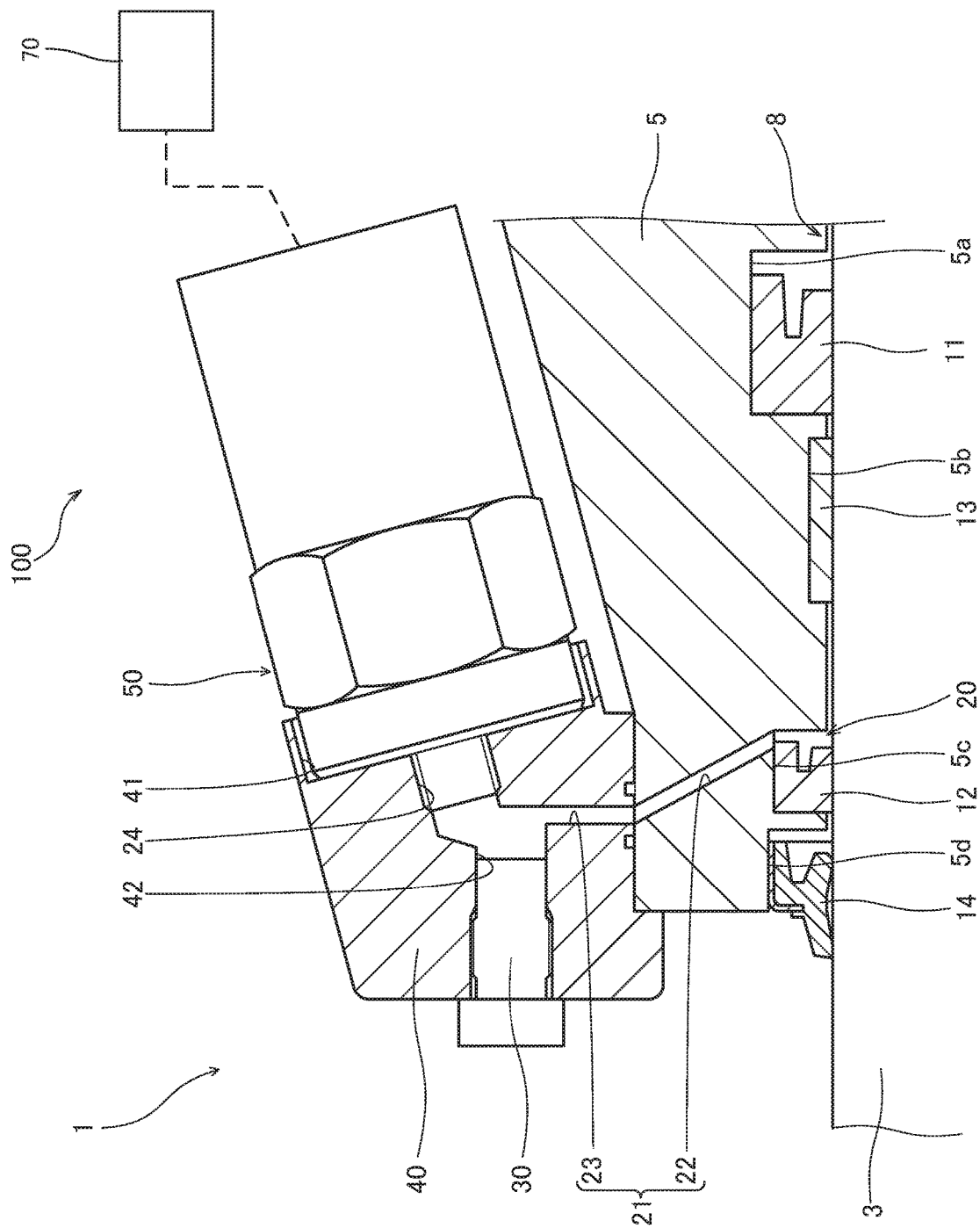
FIG. 3 is an enlarged cross-sectional view of the hydraulic cylinder according to the embodiment of the present invention.

As shown in FIG. 3, the measurement unit 10 is provided with the rod seal 11 that is provided in the cylinder head 5 and seals the annular gap 8 between the outer circumferential surface of the piston rod 3 and the inner circumferential surface of the cylinder head 5; a detection space 20 into which the working oil, which has leaked out from the rod-side chamber 2a beyond the rod seal 11, is guided; a detection seal 12 that seals the annular gap 8 by being provided in the cylinder head 5 and that partitions the detection space 20 together with the rod seal 11; a communication passage 21 that communicates with the detection space 20; a relief valve 30 that releases the pressure in the communication passage 21 by being opened when the pressure in the communication passage 21 reaches the relief pressure; a measurement part 50 that measures the state quantity of the working oil that has leaked out into the detection space 20 beyond the rod seal 11; and a housing 40 that accommodates the relief valve 30 and the measurement part 50.

In the inner circumference of the cylinder head 5, the rod seal 11, a bush 13, the detection seal 12, and a dust seal 14 are interposed in this order from the base end side (the right side in FIG. 3) to the tip end side (the left side in FIG. 3). The rod seal 11, the bush 13, the detection seal 12, and the dust seal 14 are received in annular grooves 5a, 5b, 5c, and 5d formed in the inner circumference of the cylinder head 5, respectively.

The bush 13 is provided so as to slide on the outer circumferential surface of the piston rod 3, and thereby, the piston rod 3 is supported so as be movable in the axial direction of the cylinder tube 2.

The rod seal 11 is compressed between the outer circumference of the piston rod 3 and the annular groove 5a in the inner circumference of the cylinder head 5, thereby sealing the annular gap 8. The rod seal 11 faces the rod-side chamber 2a (see FIG. 2), and the leakage of the working oil in the rod-side chamber 2a to the outside is prevented by the rod seal 11. The rod seal 11 is a so-called U-packing.

The dust seal 14 is provided in the cylinder head 5 so as to face the outside of the cylinder tube 2, and seals the annular gap 8. The dust seal 14 scrapes out dusts adhering to the outer circumferential surface of the piston rod 3, and prevents invasion of the dusts into the cylinder tube 2 from the outside.

Similarly to the rod seal 11, the detection seal 12 is compressed between the outer circumference of the piston rod 3 and the annular groove 5c in the inner circumference of the cylinder head 5, thereby sealing the annular gap 8. The detection seal 12 is provided between the rod seal 11 and the dust seal 14, and partitions the detection space 20 together with the rod seal 11. In other words, the detection space 20 is a space partitioned by the piston rod 3, the cylinder head 5, the rod seal 11, and the detection seal 12 (in the present embodiment, the bush 13 in addition thereto). Similarly to the rod seal 11, the detection seal 12 is a U-packing.

The communication passage 21 is formed from the cylinder head 5 to the housing 40 so as communicate with the detection space 20. The communication passage 21 has a first communication passage 22 formed in the cylinder head 5 so as to open to the detection space 20 and a second communication passage 23 formed in the housing 40 so as to communicate with the first communication passage 22. The working oil that has leaked out from the rod-side chamber 2a through the rod seal 11 is guided to the communication passage 21 via the annular gap 8 and the detection space 20.

The relief valve 30 is opened when the pressure of the working oil in the second communication passage 23 reaches a predetermined pressure (i.e. the relief pressure), and the working oil in the detection space 20 is discharged through the second communication passage 23 to the outside. With such a configuration, the pressure in the detection space 20 is limited to the relief pressure by the relief valve 30. Because it is possible to employ a known structure for the structure of the relief valve 30, detailed illustration and description thereof are omitted.

The housing 40 is fixed to an end part of the cylinder head 5 by being press-fitted. The housing 40 is further formed with a sensor receiving hole 41 for receiving the measurement part 50 and a valve receiving hole 42 for receiving the relief valve 30. The sensor receiving hole 41 and the valve receiving hole 42 respectively communicate with the second communication passage 23, and the valve receiving hole 42 communicates with the second communication passage 23 at the first communication passage 22 side (the upstream side) of the sensor receiving hole 41.

The measurement part 50 executes the measurement of the pressure as the state quantity of the working oil and output of the measurement result to the control unit 70 under a predetermined operating condition. The measurement part 50 executes the measurement of the pressure and temperature and the output of the measurement result at operating frequency based on the operating condition. The operating frequency includes a measurement frequency at which the measurement part 50 measures the pressure and temperature and a transmitting frequency at which the measurement result is sent from the measurement part 50 to the control unit 70.

Figure 4:
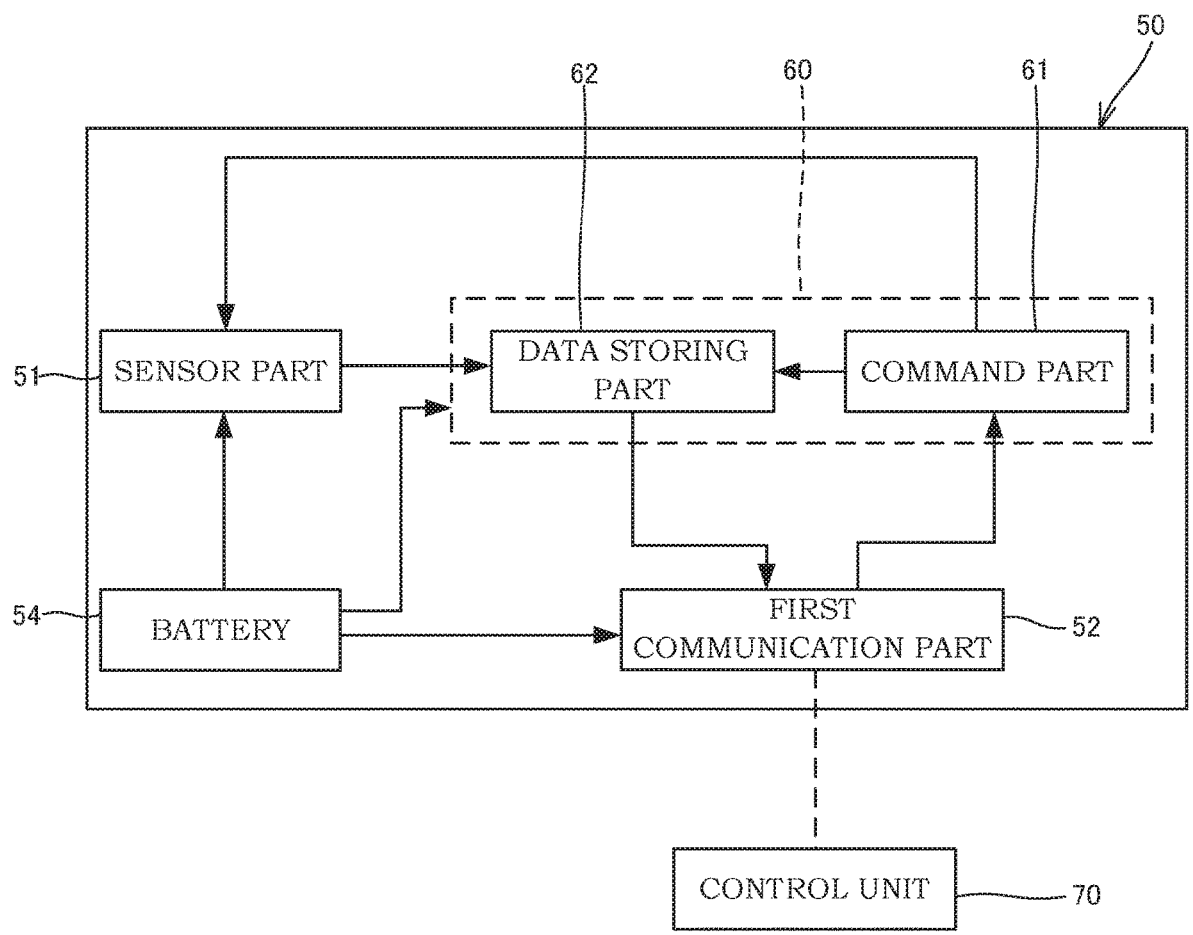
FIG. 4 is a block diagram showing a measurement unit of the fluid leakage detection system according to the embodiment of the present invention.

As shown in FIG. 4, the measurement part 50 has: a sensor part 51 serving as a pressure-temperature sensor capable of measuring the pressure and temperature; a sensor controller 60 that outputs command signal to the sensor part 51 and acquires the measurement result from the sensor part 51; a first communication part 52 that performs transmission/reception of a signal with the control unit 70 through a wireless communication; and a battery 54 serving as a power source (motive-power source) for the sensor part 51, the sensor controller 60, and the first communication part 52.

The measurement part 50 is configured such that the sensor part 51, the sensor controller 60, and the battery 54 are respectively assembled into in the same case, and as shown in FIG. 3, a part of the measurement part 50 is received in the sensor receiving hole 41 formed in the housing 40. In addition, the measurement part 50 is fixed by being screwed into a threaded hole 24 that communicates with the second communication passage 23 in the housing 40.

The sensor part 51 measures the pressure and temperature of the working oil that has been guided from the detection space 20 through the first communication passage 22 and the second communication passage 23 (see FIG. 3). The operation of the sensor part 51 will be described below in detail.

The battery 54 is electrically connected to the sensor controller 60, the sensor part 51, and the first communication part 52. Each of the sensor controller 60, the sensor part 51, and the first communication part 52 are respectively operated by a power supply from the battery 54. In addition, the sensor controller 60 acquires voltage values of the battery 54 at regular intervals.

The sensor controller 60 is configured with a microcomputer including a CPU (central processing unit), a ROM (read only memory), a RAM (random access memory), and an I/O interface (input/output interface). The RAM stores data from processing executed by the CPU, the ROM pre-stores a control program, etc. for the CPU, and the I/O interface is used for input/output of information to/from a connected device. The sensor controller 60 may be configured with a plurality of microcomputers. The sensor controller 60 is programmed so as to be at least able to execute the processing necessary for the control by the sensor controller 60 described herein. The sensor controller 60 may be configured as a single device, or may be divided into a plurality of devices and configured such that each control by the sensor controller 60 is executed by the plurality of devices in a distributed processing.

The sensor controller 60 has a command part 61 that outputs a command signal to the sensor part 51 and a data storing part 62 that acquires and accumulates the measurement result from the sensor part 51 and a remaining battery level of the battery 54.

In accordance with the command signal from the command part 61, the sensor part 51 is operated under a predetermined operating condition (the measurement frequency) to measure the pressure and temperature in the detection space 20. The measurement result from the sensor part 51 is input to the data storing part 62.

The data storing part 62 accumulates the measurement results from the sensor part 51 and the voltage values of the battery 54, and outputs the accumulated data to the control unit 70 under a predetermined operating condition (the transmitting frequency). The transmitting frequency at which the data is output from the data storing part 62 can be changed in accordance with the command signal from the command part 61. In addition, in a case in which the measurement result cannot be suitably acquired from the sensor part 51, the data storing part 62 outputs a data containing an abnormal value as the measurement result.

The first communication part 52 is electrically connected to the sensor controller 60 and performs signal transmission/reception with the sensor controller 60. In addition, the first communication part 52 is configured so as to be capable of performing the wireless communication with the control unit 70.

The control unit 70 is arranged in an operator's cab (cabin) of the construction machinery, for example. As shown in FIG. 5, the control unit 70 is provided with a second communication part 71 that performs the signal transmission/reception with the first communication part 52 of the measurement part 50 through the wireless communication and a controller 80 that performs the signal transmission/reception with the measurement part 50 of the measurement unit 10 via the second communication part 71.

The controller 80 is configured with a microcomputer including a CPU (central processing unit), a ROM (read only memory), a RAM (random access memory), and an I/O interface (input/output interface). The RAM stores data from processing executed by the CPU, the ROM pre-stores a control program, etc. for the CPU, and the I/O interface is used for input/output of information to/from a connected device. The controller 80 may be configured with a plurality of microcomputers. The controller 80 is programmed so as to be at least able to execute the processing necessary for the control by the controller 80 described herein. The controller 80 may be configured as a single device, or may be divided into a plurality of devices and configured such that each control according to the present embodiment is executed by the plurality of devices in a distributed processing.

The controller 80 acquires the measurement result from the measurement part 50, and determines whether or not the oil leakage has been caused in the hydraulic cylinder 1 on the basis of the measurement result from the measurement part 50. In addition, the controller 80 has an abnormality diagnostic function capable of diagnosing an abnormality of the measurement part 50.

The controller 80 has: a storage part 81 that stores the measurement result from the measurement part 50; a leakage determination part 82 that determines whether or not the oil leakage has been caused on the basis of the measurement result from the measurement part 50; a data-acquisition determination part 83 that determines whether or not the data has been input by the measurement part 50; a remaining-battery-level calculation part 84 that calculates the remaining battery level of the battery 54 on the basis of the voltage of the battery 54 and the temperature measured by the sensor part 51; a remaining-battery-level determination part 85 that determines whether or not the battery 54 is in the low-remaining-battery-level state by comparing the remaining battery level calculated by the remaining-battery-level calculation part 84 and a predetermined remaining-battery-level threshold value; and an abnormality diagnostic part 86 that diagnoses the abnormality of the measurement part 50.

The data (the pressure and temperature of the detection space 20, and the remaining battery level of the battery 54) transmitted from the sensor controller 60 of the measurement part 50 is stored in the storage part 81 and input to the leakage determination part 82.

The leakage determination part 82 determines whether or not the oil leakage has been caused in the hydraulic cylinder 1 on the basis of the pressure measured by the sensor part 51 of the measurement unit 10. The leakage determination part 82 determines whether or not the oil leakage has been caused every time the measurement result is input from the measurement unit 10.

The data-acquisition determination part 83 determines, at a predetermined timing, whether or not the data has been transmitted to the controller 80 from the first communication part 52 of the measurement part 50 via the second communication part 71.

The remaining-battery-level calculation part 84 calculates the remaining battery level of the battery 54 on the basis of the voltage of the battery 54 and the temperature measured by the sensor part 51 contained in the data transmitted from the measurement part 50. More specifically, the remaining-battery-level calculation part 84 calculates the remaining battery level on the basis of a map pre-stored in the storage part 81 showing a relationship between the voltage and the remaining battery level of the battery 54. The relationship between the voltage and the remaining battery level of the battery 54 changes in accordance with the ambient temperature of the battery 54. In addition, the change in the ambient temperature affects the temperature measured by the sensor part 51. Therefore, a plurality of maps are respectively pre-stored in the storage part 81 for every predetermined temperature ranges. The remaining-battery-level calculation part 84 retrieves the map corresponding to the temperature measured by the sensor part 51 from the storage part 81, and calculates the remaining battery level from the voltage of the battery 54 on the basis of the retrieved map. As described above, the remaining battery level of the battery 54 is calculated. The remaining battery level calculated by the remaining-battery-level calculation part 84 is input to the remaining-battery-level determination part 85.

When the remaining battery level calculated by the remaining-battery-level calculation part 84 is lower than the remaining-battery-level threshold value, the remaining-battery-level determination part 85 determines that the battery 54 is in the low-remaining-battery-level state in which the battery 54 may cause a battery depletion, and when the remaining battery level is equal to or higher than the remaining-battery-level threshold value, the remaining-battery-level determination part 85 determines that the battery 54 is in a normal state. The remaining-battery-level threshold value is set in accordance with specifications of each component of the measurement part 50 (the sensor part 51, the sensor controller 60, and the first communication part 52), an operating condition of the measurement part 50, and so forth. A determination result from the remaining-battery-level determination part 85 is input to the abnormality diagnostic part 86.

The abnormality diagnostic part 86 diagnoses the abnormality of the measurement part 50 on the basis of the determination results from the data-acquisition determination part 83 and the remaining-battery-level determination part 85. The abnormalities occurring in the measurement part 50 include: "the battery depletion" that is a state in which the remaining battery level of the battery 54 has become zero and the sensor part 51 and the first communication part 52 are unable to operate; "a the communication abnormality" that is a state in which the controller 80 is unable to acquire the pressure and temperature measured by the sensor part 51 due to a failure of the first communication part 52 or the second communication part 71, a poor radio wave quality, and so forth; and "a sensor failure" that is a state in which the sensor part 51 is unable to operate suitably due to a cause other than the battery depletion and unable to measure the pressure and temperature.

In a case in which it has been determined by the data-acquisition determination part 83 that the data has not been acquired, if the remaining-battery-level determination part 85 determines that the battery 54 is in the low-remaining-battery-level state, the abnormality diagnostic part 86 diagnoses that the battery depletion of the battery 54 has been caused. In addition, in a case in which it has been determined by the data-acquisition determination part 83 that the data has not been acquired, if the remaining-battery-level determination part 85 determines that the battery 54 is not in the low-remaining-battery-level state, the abnormality diagnostic part 86 diagnoses that the communication abnormality has been caused. Furthermore, in a case in which it has been determined by the data-acquisition determination part 83 that the data has been acquired, if it is determined that the abnormal value is contained in the measurement result from the sensor part 51, the abnormality diagnostic part 86 diagnoses that the sensor failure has been caused. A detail of the abnormality diagnosis will be described later.

The notification part 90 is configured so as to be able to notify the operator of the occurrence of the oil leakage in the hydraulic cylinder 1 and of the abnormality of the measurement part 50 diagnosed by the abnormality diagnostic part 86 of the controller 80. The notification part 90 is capable of notifying in various modes depending on a content (cause) of the abnormality. The notification part 90 may have any configuration including, for example, a warning lamp, a warning buzzer, a monitor (indicator), and so forth.

Next, the action of the fluid leakage detection system 100 will be described.

The operation of the measurement part 50 of the measurement unit 10 will specifically be described first.

For every measurement cycles having a predetermined time length and repeated at predetermined time intervals, the sensor part 51 measures the pressure and temperature at a predetermined sampling period. When the accumulated data (the measurement result from the sensor part 51 and the remaining battery level of the battery 54) reached a predetermined data size, the data storing part 62 transmits the accumulated data to the control unit 70 via the first communication part 52. In the following, a time length of the measurement cycle (a time duration from the beginning to the end of the measurement cycle) is referred to as "a measurement time duration Td", and a time interval between the beginning of one measurement cycle and the beginning of a next measurement cycle is referred to as "a cycle interval CT". In addition, the sampling period of the sensor part 51 is referred to as "a sampling period SC", and a data size to which the measurement results are accumulated by the data storing part 62 before being transmitted (output) is referred to as "a transmission size Dc". The operating condition of the measurement part 50 includes the measurement time duration Td, the sampling period SC, and the cycle interval CT, which are conditions for the sensor part 51 to detect the pressure and temperature, and the transmission size Dc, at which the data storing part 62 transmits the measurement result from the sensor part 51 to the controller 80 of the control unit 70.

Figure 6:
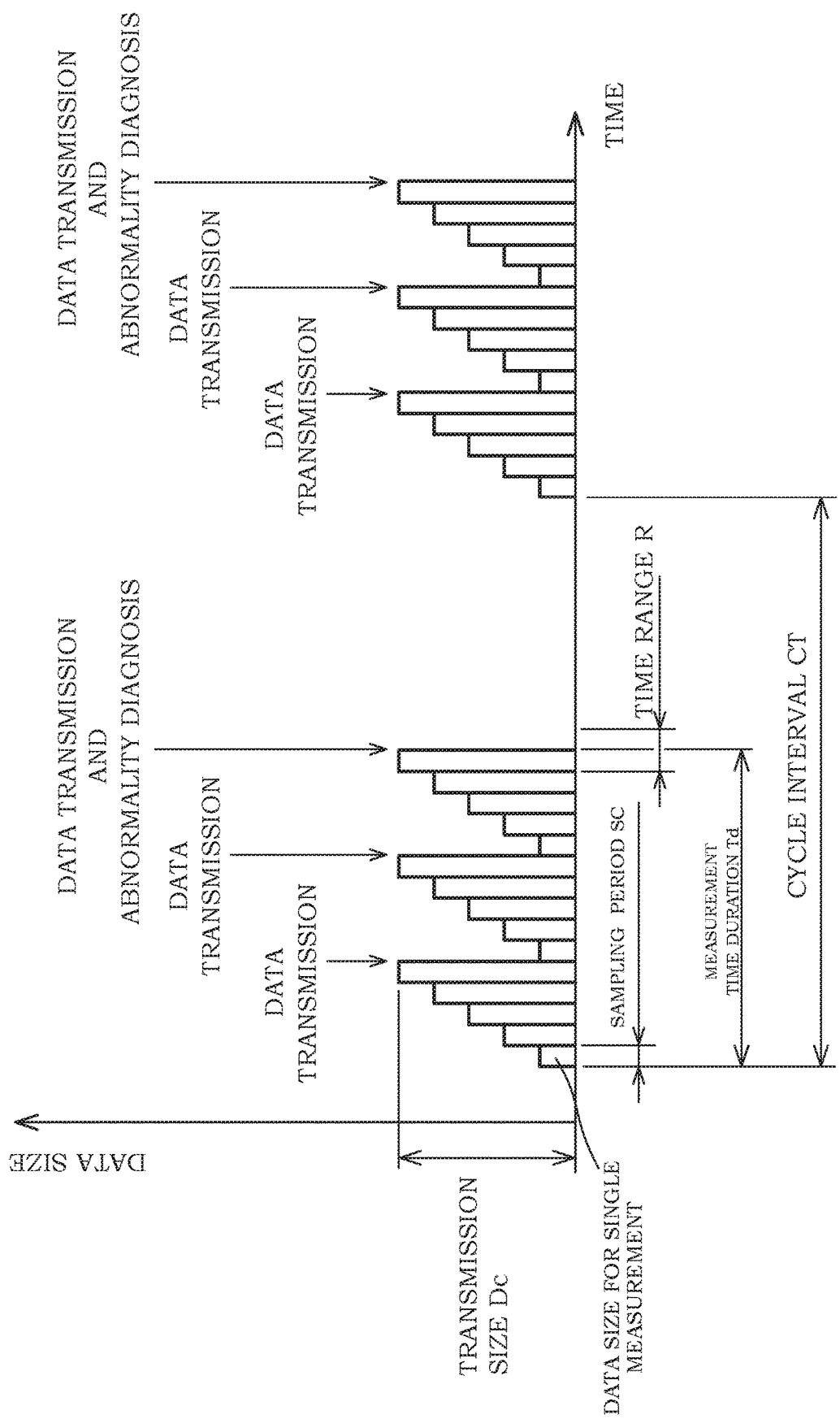
FIG. 6 is a schematic graph diagram for explaining an operating condition for a measurement part of the fluid leakage detection system according to the embodiment of the present invention, and the vertical axis shows data size accumulated in a data storing part and the horizontal axis shows time.

FIG. 6 is a schematic graph diagram showing a relationship between time and the data size of the measurement result accumulated in the data storing part 62. As shown in FIG. 6, during the measurement time duration Td, the sensor part 51 measures the pressure and temperature in the detection space 20 at every sampling periods SC, and finishes the measurement of the pressure and temperature when the measurement time duration Td has been elapsed from the beginning of the detection. After the sensor part 51 has finished the measurement of the pressure and temperature, the sensor part 51 is shifted to a standby state (a sleep state) during which the pressure and temperature are not measured.

The measurement result from the sensor part 51 is accumulated in the data storing part 62. The data storing part 62 outputs the accumulated data to the first communication part 52 every time the measurement results are accumulated until the data size reaches the transmission size Dc. In FIG. 6, the data size of the measurement results for five measurements corresponds to the transmission size Dc. The first communication part 52 wirelessly transmits the data, which has been output from the data storing part 62, to the second communication part 71 of the controller 80. The transmitting frequency is set in accordance with the transmission size Dc at which the data is transmitted to the controller 80 from the data storing part 62 of the sensor controller 60 in the measurement part 50.

As shown in FIG. 6, in the data storing part 62, although the accumulated data is deleted every time the accumulated data is output to the first communication part 52, the data may be accumulated continuously without being limited thereto.

As described above, the sensor part 51 measures the pressure and temperature in the detection space 20 intermittently and not constantly (continuously). In addition, the measurement result from the sensor part 51 is not transmitted to the controller 80 as soon as it is acquired, but the measurement result is accumulated in the data storing part 62 until it reaches the transmission size Dc, and then, the measurement result is transmitted to the controller 80. In other words, the measurement result from the sensor part 51 is transmitted to the controller 80 intermittently. Because the measurement by the sensor part 51 and the transmission of the measurement result from the data storing part 62 are respectively executed intermittently, it is possible to reduce power consumption. The operating condition of the measurement part 50 can be changed by the signal from the controller 80, and it may also be possible for the sensor part 51 and the data storing part 62 to execute a continuous measurement and the output of the measurement result (the data transmission), respectively.

In addition, the voltage of the battery 54 is accumulated in the data storing part 62 and is transmitted to the controller 80 together with the measurement result from the sensor part 51 via the first communication part 52. As described later, it suffices to transmit the voltage of the battery 54 to the controller 80 at an occasion of the last data transmission during the measurement cycle in which the abnormality diagnosis is executed, and the voltage of the battery 54 may not necessarily be transmitted to the controller 80 every time.

Next, the determination of the oil leakage performed by the controller 80 will be described.

As deterioration of the rod seal 11 of the hydraulic cylinder 1 progresses, the hydraulic pressure in the rod-side chamber 2a is guided into the detection space 20 beyond the rod seal 11. Thus, as the rod seal 11 is being deteriorated, the pressure and temperature in the detection space 20 are increased. In the fluid leakage detection system 100, the oil leakage in the hydraulic cylinder 1 is detected by measuring the pressure in the detection space 20 by the measurement part 50 of the measurement unit 10 and by determining whether or not the oil leakage has been caused by the controller 80 of the control unit 70 on the basis of the measurement result. In this specification, "the deterioration" of the rod seal 11 includes wear and damage. The wear is cause by routine load such as a reciprocating movement of the piston rod 3, etc., and refers to the deterioration due to the lifetime. The damage refers to the deterioration due to an accidental load applied by an accident, etc.

More specifically, in the determination of the oil leakage, the determination of the oil leakage is performed on the basis of the pressure in the detection space 20 in this embodiment. Every time the measurement result from the sensor part 51 is transmitted from the data storing part 62 of the sensor controller 60, the leakage determination part 82 of the controller 80 acquires the highest pressure value as the pressure data from the transmitted data group. The leakage determination part 82 compares the highest pressure value with a preset determination threshold value, and determines that the oil leakage has been caused if the highest pressure value is equal to or higher than the determination threshold value. When it is determined that the oil leakage has been caused by the leakage determination part 82, the determination result is transmitted to the notification part 90, and the operator is notified of the occurrence of the oil leakage. As described above, the oil leakage in the hydraulic cylinder 1 is detected. On the other hand, in a case in which the highest pressure value is smaller than the determination threshold value, the leakage determination part 82 determines that the oil leakage has not been caused.

The phrase "the oil leakage has not been caused" as used in this specification does not have a strict meaning, and does not solely mean a state in which the working oil has not been leaked at all into the detection space 20 beyond the rod seal 11. For example, even in a case in which the working oil has leaked from the rod-side chamber 2a into the detection space 20, if the degree of the deterioration (wear/damage) of the rod seal 11 is acceptable, the leakage determination part 82 determines that "the oil leakage has not been caused". In other words, the phrase "the oil leakage has been caused" refers to a state in which the deterioration (wear/damage) of the rod seal 11 has exceeded an allowable range. Thus, the determination threshold value is set according to the allowable degree of the deterioration (wear/damage) of the rod seal 11.

In addition, the pressure data used for determination of the occurrence the oil leakage is not limited to the highest pressure value, and other values may be used. For example, as the pressure data, a single measured value, such as the lowest pressure value, the median value, and so forth, contained in the data group transmitted may be employed, or a value, such as the average value, calculated by computing the measured values may be employed. In other words, the pressure data contains the measured value itself of the pressure measured by the sensor part 51, and also a value obtained from the measured values.

Next, the abnormality diagnosis of the measurement part 50 by the controller 80 will be described.

If the abnormality is caused in the measurement part 50 and the controller 80 cannot suitably acquire the measurement result from the sensor part 51, the determination of the occurrence of the oil leakage cannot be performed. Therefore, in order to detect the occurrence of the oil leakage with a higher reliability, it is required to diagnose occurrence of the abnormality in the measurement part 50, and to take an appropriate measures in accordance with the nature of the abnormality when the abnormality has been caused.

Thus, in this embodiment, the controller 80 executes the abnormality diagnosis that diagnoses whether or not the abnormality, such as "the battery depletion", "the communication abnormality", "the sensor failure", and so forth, has been caused in the measurement part 50.

The abnormality diagnosis executed by the controller 80 will be described below with reference to a flowchart shown in FIG. 7.

Figure 7:
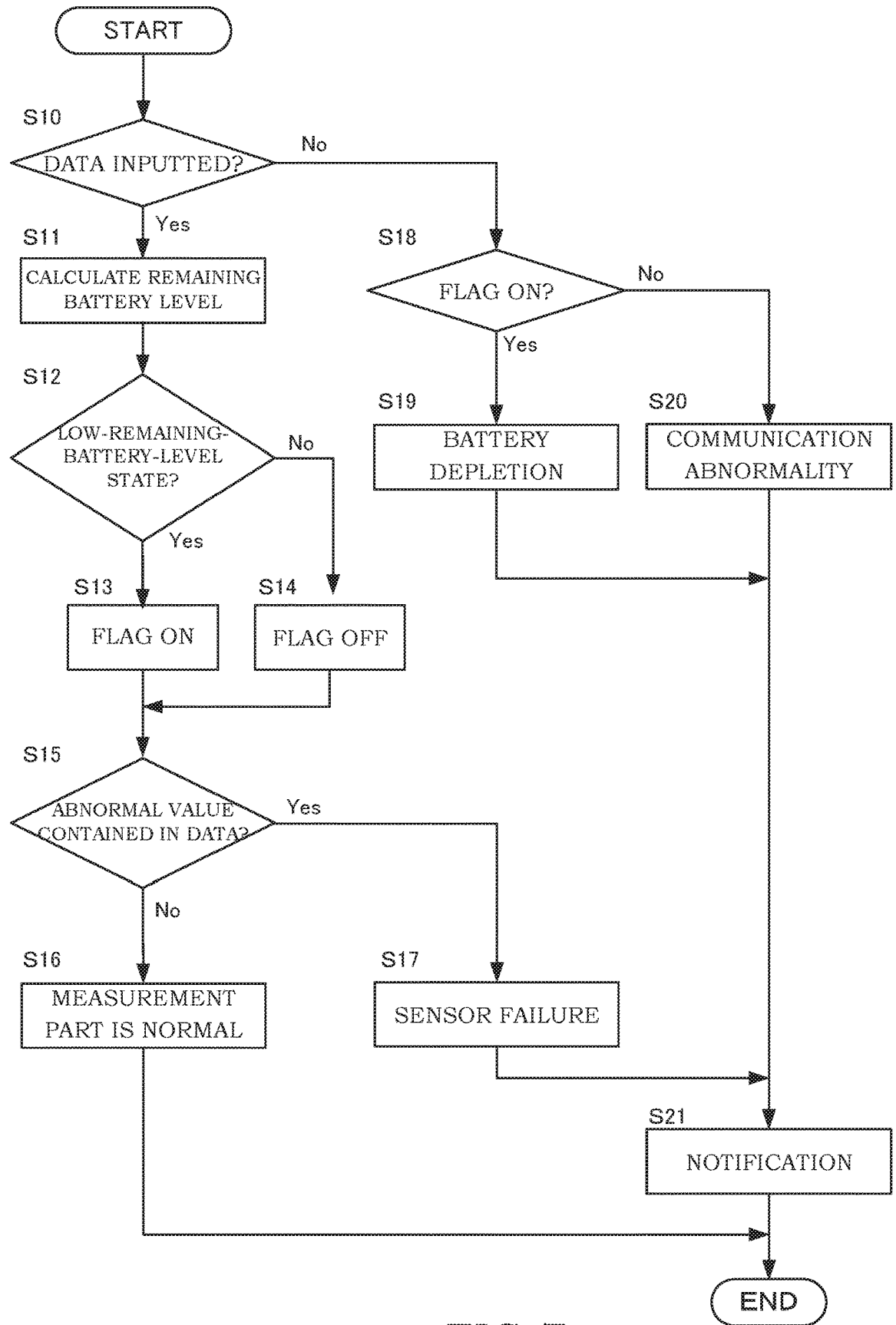
FIG. 7 is a flowchart for explaining an abnormality diagnosis executed by the fluid leakage detection system according to the embodiment of the present invention.

The controller 80 executes the process shown in FIG. 7 at a predetermined cycle. Specifically, as shown in FIG. 6, the controller 80 executes the abnormality diagnosis at a timing at which the last data is transmitted in each measurement cycle. An execution cycle of the abnormality diagnosis is not limited thereto, and it can be set arbitrarily.

In Step 10, it is determined, at a predetermined timing, whether or not the data from the measurement part 50 has been input to the controller 80. The phrase "a predetermined timing" refers to a timing within a predetermined time range R (see FIG. 6) including the timing at which the measurement cycle is finished (the timing of the last data transmission). When the data is input from the measurement part 50 within the time range R, the process proceeds to Step 11.

In Step 11, the remaining battery level of the battery 54 is calculated from the voltage of the battery 54 by using the map corresponding to the temperature in the detection space 20.

In Step 12, it is determined whether or not the battery 54 is in the low-remaining-battery-level state by comparing the remaining battery level of the battery 54 and the remaining-battery-level threshold value. If the remaining battery level of the battery 54 is lower than the remaining-battery-level threshold value, it is determined that the battery 54 is in the low-remaining-battery-level state, and the process proceeds to Step 13 to activate a flag for the battery depletion (ON). If the remaining battery level of the battery 54 is equal to or higher than the remaining-battery-level threshold value, it is determined that the battery 54 is in the normal state, and the process proceeds to Step 14 to deactivate the flag for the battery depletion (OFF).

In Step 15, it is determined whether or not the abnormal value is contained in the measurement result from the sensor part 51, which is contained in the data input to the controller 80. As described above, in a case in which the sensor part 51 cannot suitably measure the pressure and temperature, the measurement part 50 (the data storing part 62) transmits the data containing the abnormal value to the controller 80 as the measurement result. Thus, by determining whether or not the abnormal value is contained in the measurement result from the sensor part 51, it is possible to determine whether or not the sensor failure has been caused.

In Step 15, in a case in which the abnormal value is not contained in the measurement result, it is determined that the measurement part 50 is in the normal state in Step 16, and the process is terminated.

In Step 15, in a case in which the abnormal value is contained in the measurement result, it is determined that the sensor failure has been caused in Step 17.

In Step 10, when it is determined that the data is not input to the controller 80, it is diagnosed in Steps 18 to 20 whether the measurement part 50 is in the battery depletion state or in the communication abnormality state.

In Step 18, it is determined whether or not the flag for the battery depletion is ON. If the battery 54 is in the low-remaining-battery-level state and the battery depletion flag is set to ON in the last executed abnormality diagnosis in Steps 12 and 13, in the current abnormality diagnosis, the process proceeds from Step 18 to Step 19, and it is determined that the measurement part 50 is in the battery depletion state. On the other hand, if the battery depletion flag is set to OFF in the previously executed abnormality diagnosis, the process proceeds from Step 18 to Step 20 in the current abnormality diagnosis, and it is diagnosed that the communication abnormality, but not the battery depletion, has been caused.

When the occurrence of the abnormality is diagnosed in Steps 17, 19, or 20, the operator is notified of the occurrence of the abnormality and its mode in Step 21, and the process is terminated.

As described above, in the abnormality diagnosis according to this embodiment, it is first determined whether or not the data has been transmitted (input) to the controller 80 from the measurement part 50, and thereby, it is diagnosed whether the measurement part 50 is in "the normal state", or in "the sensor failure state", "the battery depletion state", or "the communication abnormality state".

The remaining battery level of the battery 54 is calculated in a state in which the data has been input to the controller 80 (in other words, in a state in which neither of "the battery depletion" and "the communication abnormality" has been caused), and if it is in the low-remaining-battery-level state, the battery depletion flag is set to ON. Subsequently, as the input of the data to the controller 80 is stopped, it is determined whether the measurement part 50 is in "the battery depletion state" or "the communication abnormality" by using the battery depletion flag. As described above, by setting the flag for the battery depletion while in a state in which the input of the data to the controller 80 is executed, it is possible to determine whether the measurement part 50 is in "the battery depletion state" or "the communication abnormality" even after the input of the data to the controller 80 is stopped.

In addition, in a case in which the sensor part 51 cannot suitably measure the pressure and temperature, the sensor controller 60 transmits the measurement result containing the abnormal value to the controller 80. In the abnormality diagnosis, it is diagnosed whether the measurement part 50 is in "the normal state" or "the sensor failure state" by determining whether or not the abnormal value is contained in the measurement result.

By executing the abnormality diagnosis as described above, it is possible to diagnose whether or not "the battery depletion", "the communication abnormality", or "the sensor failure" has been cause in the measurement part 50. Thus, an appropriate measures can be taken in accordance with the diagnosed result, and so, it is possible to detect the oil leakage by the fluid leakage detection system 100 with a higher reliability.

Next, a modification of this embodiment will be described.

Figure 8:
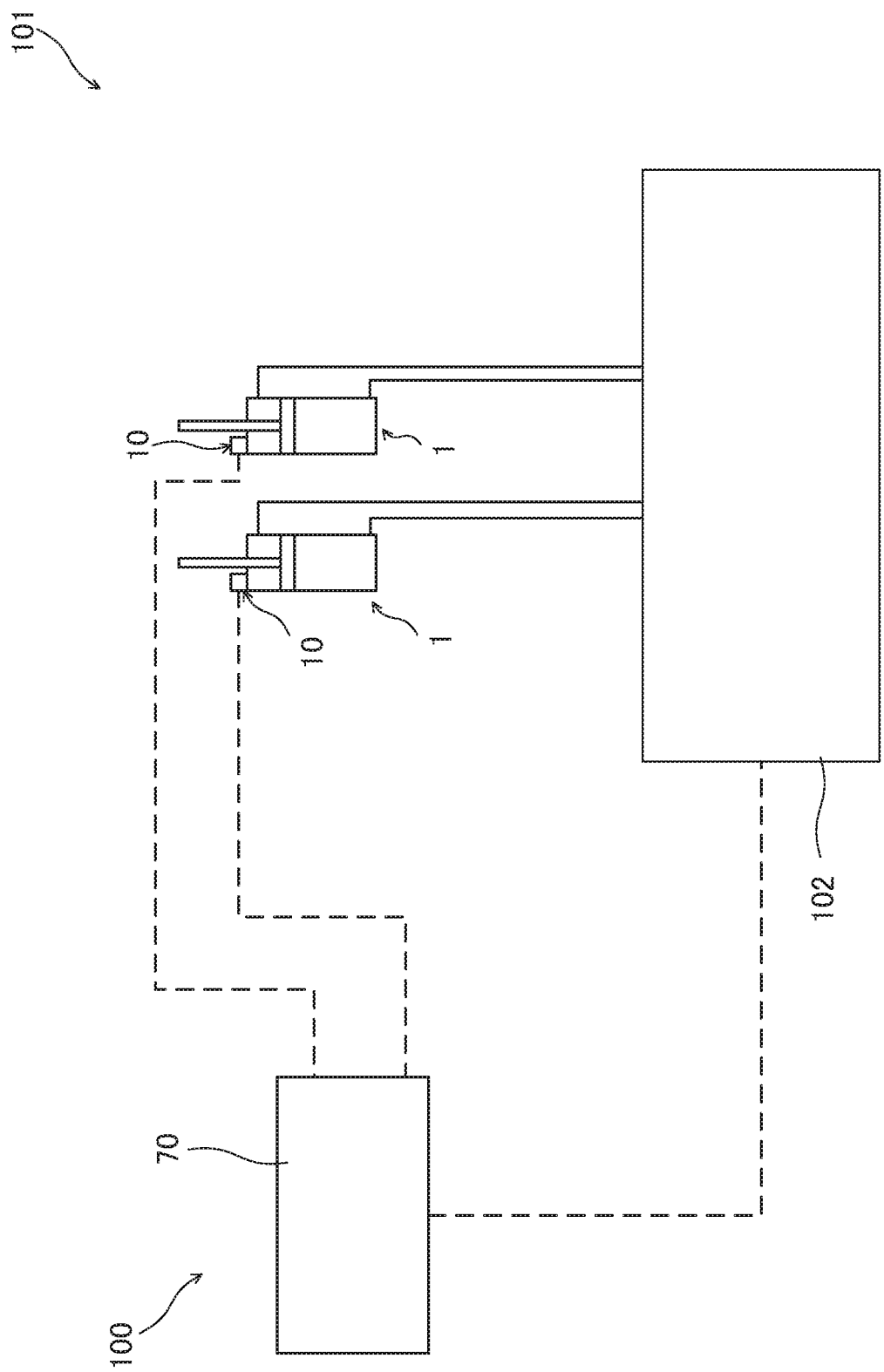
FIG. 8 is a schematic view showing a configuration of a modification of the fluid leakage detection system according to the embodiment of the present invention.

In the above-mentioned embodiment, it is determined whether or not the controller 80 has been able to suitably acquire the data by determining whether or not the data has been input to the controller 80 within the predetermined time range R including the timing at which the measurement cycle is finished. In contrast, in the modification shown in FIG. 8, the fluid pressure system 101 is provided with a plurality of hydraulic cylinders 1 (two in the figure), and the measurement unit 10 is provided on each of the hydraulic cylinders 1. In this modification, the controller 80 is shared by the hydraulic cylinders 1, and the measurement units 10 of the respective hydraulic cylinders 1 are operated under the same operating condition with each other. In such a modification, when the abnormality diagnosis is executed to the measurement part 50 provided on one of the hydraulic cylinders 1, a timing for determining whether or not the controller 80 has acquired the data may be set within a time range including a timing at which the controller 80 has acquired the data from the measurement part 50 of the measurement unit 10 of the other of the hydraulic cylinders 1. Also in this case, the operational advantages similar to those in the above-mentioned embodiment are afforded.

In addition, in the above-mentioned embodiment, the sensor part 51 measures the pressure as the state quantity of the working oil, and the leakage determination part 82 of the controller 80 determines the occurrence of the leakage of the working oil on the basis of the pressure measured by the sensor part 51. In contrast, the sensor part 51 may measure the state quantity other than the pressure, and the leakage determination part 82 may determine the occurrence of the leakage of the working oil on the basis of the state quantity measured by the sensor part 51. For example, the sensor part 51 may measure dielectric constant of the working oil guided to the detection space 20 as the state quantity, and the leakage determination part 82 may determine the occurrence of the leakage of the working oil on the basis of the dielectric constant.

In addition, in the above-mentioned embodiment, the sensor part 51 is the pressure-temperature sensor capable of measuring the pressure and temperature. The occurrence of the oil leakage is determined on the basis of the pressure measured by the sensor part 51, and the remaining battery level of the battery 54 is calculated on the basis of the temperature (and the voltage of the battery 54) measured by the sensor part 51. In contrast, in order to determine the occurrence of the leakage of the working oil, the measurement part 50 may have the sensor part 51 that measures the state quantity of the working oil and a temperature sensor that measures the temperature for calculating the remaining battery level of the battery 54, in a separately manner. Furthermore, the measurement part 50 may not necessarily be configured so as to be capable of measuring temperature, and the remaining battery level of the battery 54 may not be calculated on the basis of temperature.

According to the embodiment mentioned above, the advantages described below are afforded.

In the fluid leakage detection system 100, it is determined whether or not the data has been transmitted (inputted) to the controller 80 from the measurement part 50, and in a case in which the data has not been input, it is diagnosed whether the measurement part 50 is in "the battery depletion state" or "the communication abnormality state" by determining whether or not the battery 54 is in the low-remaining-battery-level state. In addition, in a case in which the data has been input from the measurement part 50 to the controller 80, it is diagnosed whether the measurement part 50 is in "the normal state" or "the sensor failure state" by determining whither or not the abnormal value is contained in the measurement result from the measurement part 50. As described above, in the fluid leakage detection system 100, the abnormality of the measurement part 50 can be diagnosed, and so, it is possible to detect the occurrence of the oil leakage with a higher reliability.

In addition, in the fluid leakage detection system 100, the remaining battery level of the battery 54 can be calculated on the basis of the plurality of maps stored in the storage part 81 correspondingly to temperatures. Therefore, is possible to accurately calculate the remaining battery level of the battery 54.

The configurations, operations, and effects of the embodiments of the present invention will be collectively described below.

The fluid leakage detection system 100 is configured to detect the leakage of the working oil in the hydraulic cylinder 1 having the piston rod 3 extended from the cylinder tube 2 and the cylinder head 5 through which the piston rod 3 is inserted, the cylinder head 5 being provided on the cylinder tube 2, and the leakage of the working oil being caused through the annular gap 8 between the piston rod 3 and the cylinder head 5. The fluid leakage detection system 100 includes: the measurement unit 10 provided in the hydraulic cylinder 1, the measurement unit 10 being configured to measure the state quantity of the working oil leaking out through the annular gap 8 between the piston rod 3 and the cylinder head 5; and the controller 80 configured to acquire the measurement result from the measurement unit 10, wherein the measurement unit 10 has: the rod seal 11 provided in the cylinder head 5, the rod seal 11 being configured to seal the annular gap 8 between the piston rod 3 and the cylinder head 5; the detection space 20 to which the working oil leaked out through the rod seal 11 is guided; and the measurement part 50 configured to execute, under a predetermined operating condition, measurement of the temperature of the working oil in the detection space 20 and output of the measurement result, the measurement part 50 has: the battery 54 configured to function as the power source; the sensor part 51 configured to measure the state quantity of the working oil in the detection space 20; and the first communication part 52 configured to transmit the data containing the measurement result from the sensor part 51 and the voltage of the battery 54 to the controller 80 through the wireless communication, the controller 80 has: the data-acquisition determination part 83 configured to determine whether or not the data has been input from the measurement part 50; the remaining-battery-level calculation part 84 configured to calculate the remaining battery level based on the voltage of the battery 54; the remaining-battery-level determination part 85 configured to determine whether or not the battery 54 is in the low-remaining-battery-level state by comparing the remaining battery level calculated by the remaining-battery-level calculation part 84 and the predetermined remaining-battery-level threshold value; and the abnormality diagnostic part 86 configured to diagnose occurrence of the abnormality in the measurement part 50, and wherein the abnormality diagnostic part 86 diagnoses that the battery depletion is caused in the battery 54 when the data-acquisition determination part 83 determines that the data is not acquired and when the remaining-battery-level determination part 85 determines that the battery 54 is in the low-remaining-battery-level state, and the abnormality diagnostic part 86 diagnoses that the communication abnormality is caused in the first communication part 52 when the data-acquisition determination part 83 determines that the data is not acquired and when the remaining-battery-level determination part 85 determines that the battery 54 is not in the low-remaining-battery-level state.

In addition, in the fluid leakage detection system 100, the data-acquisition determination part 83 determines that the data is not acquired when the data is not input at a predetermined timing.

In addition, in the fluid leakage detection system 100, the measurement part 50 measures the state quantity of the working oil at every measurement cycles, the measurement cycles having a predetermined time length and being repeated at every predetermined time intervals, and the predetermined timing is set within a predetermined time range including a timing at which the measurement cycle is finished.

In addition, the fluid leakage detection system 100 further includes a plurality of the measurement units 10 respectively provided on a plurality of the hydraulic cylinders 1, wherein a predetermined timing is set within a predetermined time range including a timing at which the data is acquired from the measurement part 50 of the other of the measurement units 10.

With these configurations, by utilizing the remaining battery level of the battery 54 and the determination on the communication with the first communication part 52, it is possible to diagnose whether a state in which the data has not been acquired by the controller 80 is a state in which the data has not been acquired due to the battery depletion or a state in which the data has not been acquired due to an abnormality caused in the communication. Therefore, it is possible to diagnose the occurrence of the abnormality in the fluid leakage detection system 100.

In addition, in the fluid leakage detection system 100, the measurement part 50 further has the sensor controller 60 that acquires the measurement result from the sensor part 51, the sensor controller 60 being configured to output the measurement result to the first communication part 52, the sensor controller 60 outputs the measurement result containing the abnormal value to the first communication part 52 when the sensor part 51 cannot measure the state quantity of the working oil, and the abnormality diagnostic part 86 diagnoses that the sensor failure, which indicates a failure has been caused in the sensor part 51, has been caused when a communication determination part determines that a communication from the first communication part 52 is executed and when the abnormal value is contained in the measurement result from the sensor part 51.

With this configuration, it is possible to diagnose whether or not the sensor failure has been caused by determining whether or not the abnormal value is contained in the measurement result from the sensor part 51.

In addition, in the fluid leakage detection system 100, the measurement part 50 is configured so as to be capable of measuring the temperature, and the remaining-battery-level calculation part 84 calculates the remaining battery level of the battery 54 based on the temperature measured by the measurement part 50 and the voltage of the battery 54.

With this configuration, because the remaining battery level of the battery 54 is calculated by taking consideration of influence of the temperature, it is possible to accurately calculate the remaining battery level of the battery 54.

Embodiments of this invention were described above, but the above embodiments are merely examples of applications of this invention, and the technical scope of this invention is not limited to the specific constitutions of the above embodiments.

This application claims priority based on Japanese Patent Application No. 2018-151708 filed with the Japan Patent Office on Aug. 10, 2018, the entire contents of which are incorporated into this specification.

The invention claimed is:

1. A fluid leakage detection system configured to detect leakage of working fluid in a fluid pressure cylinder having a piston rod extended from a cylinder tube and a cylinder head through which the piston rod is inserted, the cylinder head being provided on the cylinder tube, and the leakage of the working fluid being caused through a gap between the piston rod and the cylinder head, the fluid leakage detection system comprising:
   a measurement unit provided on the fluid pressure cylinder, the measurement unit being configured to measure a state quantity of the working fluid leaking out through the gap between the piston rod and the cylinder head; and
   a controller configured to acquire a measurement result from the measurement unit, wherein
   the measurement unit has:
      a rod seal provided in the cylinder head, the rod seal being configured to seal the gap between the piston rod and the cylinder head;
      a detection space to which the working fluid leaked out through the rod seal is guided; and
      a measurement part configured to execute, under a predetermined operating conditions, measurement of the state quantity of the working fluid in the detection space and output the measurement result,
   the measurement part has:
      a battery configured to function as a power source;
      a sensor part configured to measure the state quantity of the working fluid in the detection space; and
      a communication part configured to transmit a data containing the measurement result from the sensor part and a voltage of the battery to the controller through a wireless communication,
   the controller has:
   a data-acquisition determination part configured to determine whether or not the data has been acquired from the measurement part;
      a remaining-battery-level calculation part configured to calculate a remaining battery level based on the voltage of the battery;
      a remaining-battery-level determination part configured to determine whether or not the battery is in a low-remaining-battery-level state by comparing the remaining battery level calculated by the remaining-battery-level calculation part and a predetermined remaining-battery-level threshold value; and
      an abnormality diagnostic part configured to diagnose occurrence of each of a plurality of abnormalities in the measurement part, wherein
      the plurality of abnormalities include a battery depletion and a communication abnormality, and
      the abnormality diagnostic part diagnoses that the battery depletion is caused in the battery, when the data-acquisition determination part determines that the data is not acquired and the remaining-battery-level determination part determines that the battery is in the low-remaining-battery-level state, and
      the abnormality diagnostic part diagnoses that the communication abnormality is caused in the communication part, when the data-acquisition determination part determines that the data is not acquired and the remaining-battery-level determination part determines that the battery is not in the low-remaining-battery-level state.

2. The fluid leakage detection system according to claim 1, wherein
   the data-acquisition determination part determines that the data is not acquired when the data is not input at a predetermined timing.

3. The fluid leakage detection system according to claim 2, wherein the measurement part repeatedly measures the state quantity of the working fluid at a plurality of measurement cycles, each of the measurement cycles having a predetermined time length and any adjacent two of the measurement cycles being separated by a predetermined time interval, and the predetermined timing is set within a predetermined time range, which includes a timing at which one of the measurement cycles ends.

4. The fluid leakage detection system according to claim 2 further comprising a plurality of the measurement units respectively provided on a plurality of the fluid pressure cylinders, wherein the predetermined timing is set within a predetermined time range including a timing at which the data is acquired from the measurement part of other of the measurement units.

5. The fluid leakage detection system according to claim 1, wherein the measurement part further has a sensor controller that acquires the measurement result from the sensor part, the sensor controller being configured to output the measurement result to the communication part, the sensor controller outputs the measurement result containing an abnormal value to the communication part when the sensor part cannot measure the state quantity of the working fluid, the plurality of abnormalities further include a failure in the sensor part, and the abnormality diagnostic part diagnoses that the failure has occurred in the sensor part when the data-acquisition determination part determines that the data is acquired and the abnormal value is contained in the measurement result from the sensor part.

6. The fluid leakage detection system according to claim 1, wherein the measurement part is configured so as to be capable of measuring temperature in the detection space, and the remaining-battery-level calculation part calculates the remaining battery level of the battery based on the temperature measured by the measurement part and the voltage of the battery.

\* \* \* \* \*